United States Patent
Motoya et al.

(10) Patent No.: US 8,361,918 B2
(45) Date of Patent: *Jan. 29, 2013

(54) CERAMIC COMPOSITION, METHOD FOR PRODUCING THE SAME, CERAMIC SUBSTRATE AND METHOD FOR PRODUCING CERAMIC GREEN LAYER

(75) Inventors: Machiko Motoya, Kusatsu (JP); Tsutomu Tatekawa, Otsu (JP); Jun Urakawa, Omihachiman (JP); Tsuyoshi Katsube, Yasu (JP); Yoichi Moriya, Kyoto (JP)

(73) Assignee: Murata Manufacturing Co., Ltd., Nagaokakyo-Shi, Kyoto-fu (JP)

( * ) Notice: Subject to any disclaimer, the term of this patent is extended or adjusted under 35 U.S.C. 154(b) by 436 days.

This patent is subject to a terminal disclaimer.

(21) Appl. No.: 12/706,291

(22) Filed: Feb. 16, 2010

(65) Prior Publication Data

US 2010/0139957 A1 Jun. 10, 2010

Related U.S. Application Data

(63) Continuation of application No. PCT/JP2008/063633, filed on Jul. 30, 2008.

(30) Foreign Application Priority Data

Aug. 17, 2007 (JP) .................. 2007-212548
Feb. 1, 2008 (JP) .................. 2008-023335
Mar. 14, 2008 (JP) .................. 2008-065203

(51) Int. Cl.
  *B32B 7/02* (2006.01)
  *C04B 35/195* (2006.01)
(52) U.S. Cl. ......... 501/125; 501/128; 428/210; 428/901
(58) Field of Classification Search .................. 501/125, 501/128; 428/210, 901
See application file for complete search history.

(56) References Cited

U.S. PATENT DOCUMENTS

| | | | | |
|---|---|---|---|---|
| 8,173,565 | B2 * | 5/2012 | Katsube | 501/135 |
| 2010/0139957 | A1 * | 6/2010 | Motoya et al. | 174/257 |
| 2011/0284270 | A1 * | 11/2011 | Katsube et al. | 174/251 |
| 2011/0300355 | A1 * | 12/2011 | Katsube | 428/210 |

FOREIGN PATENT DOCUMENTS

| | | | |
|---|---|---|---|
| JP | 2002-173362 A | | 6/2002 |
| JP | 2005-298259 A | | 10/2005 |
| JP | 2007-119288 A | | 5/2007 |
| WO | WO-2007/116010 A2 | | 10/2007 |
| WO | 2010079696 | * | 7/2010 |
| WO | 2010092969 | * | 8/2010 |
| WO | 2010092970 | * | 8/2010 |

OTHER PUBLICATIONS

Written Opinion of International Searching Authority, mailed Apr. 11, 2008.

* cited by examiner

*Primary Examiner* — Karl Group
(74) *Attorney, Agent, or Firm* — Dickstein Shapiro LLP

(57) ABSTRACT

To provide a ceramic composition not only having little compositional variation after burning, but a high flexural strength of the sintered body, and a high Q value in a microwave band, a ceramic composition used for forming a ceramic layer of a multi-layer ceramic substrate contains 47.0 to 67.0 wt. % of $SiO_2$, 21.0 to 41.0 wt. % of BaO, and 10.0 to 18.0 wt. % of $Al_2O_3$, and contains as a first additive, 1.0 to 5.0 parts by weight of $CeO_2$, relative to a total of 100 parts of $SiO_2$, BaO and $Al_2O_3$, and as a second additive, 2.5 to 5.5 parts by weight of MnO, relative to a total of 100 parts by weight of $SiO_2$, BaO, $Al_2O_3$ and $CeO_2$, and is substantially free of Cr. As a third additive, at least one of Zr, Ti, Zn, Nb, Mg and Fe, and as a fourth additive, a Co component and/or a V component, may be contained.

19 Claims, 1 Drawing Sheet

CERAMIC COMPOSITION, METHOD FOR PRODUCING THE SAME, CERAMIC SUBSTRATE AND METHOD FOR PRODUCING CERAMIC GREEN LAYER

This is a continuation of application Serial No. PCT/JP2008/063633, filed Jul. 30, 2008, and incorporated herein by reference.

TECHNICAL FIELD

The present invention relates to a ceramic composition and a method for producing the same, a ceramic substrate formed by using the ceramic composition, and a method for producing a ceramic green layer containing the ceramic composition.

BACKGROUND ART

Ceramic compositions of interest to the present invention include, for example, the one described in Japanese Unexamined Patent Publication No. 2002-173362 (Patent Document 1). The ceramic composition described in Patent Document 1 concretely contains 35.0 to 65.0% by weight (wt. %) in terms of $SiO_2$ of a Si component, 20.0 to 50.0 wt. % in terms of $BaCO_3$ of a Ba component, 5.0 to 35.0 wt. % in terms of $MnCO_2$ of a Mn component, 3.0 to 10.0 wt. % in terms of $Al_2O_3$ of an Al component, 0.3 to 3.0 wt. % in terms of $Cr_2O_3$ of a Cr component, and 0.3 to 3.0 wt. % in terms of $CaCO_3$ of a Ca component, and does not contain $B_2O_3$, namely a B component.

Since the B component is liable to scatter at the time of burning, it is necessary to conduct burning in a container-like sheath capable of enclosing the atmosphere for a ceramic composition containing the same, and hence, the size of a gap communicating between the inside and outside the sheath varies due to variations in accuracy of dimension and shape of the sheath, and as a result, variation can arise in composition of the ceramic composition after burning. However, such a problem will not occur in the ceramic composition described in Patent Document 1.

On the other hand, since a Mn component is contained in the ceramic composition described in Patent Document 1 instead of a B component that is liable to scatter, burning in a container-like sheath is not required, and thus burning can be conducted on a simple tray which is called a setter.

However, the flexural strength of the obtained sintered body with the ceramic composition described in Patent Document 1 is as low as about 150 to 200 MPa, which is not sufficient. Also, the Q value in the microwave band (for example, 3 GHz) is not sufficient, and a high Q×f value is not obtained.

Patent Document 1: Japanese Unexamined Patent Publication No. 2002-173362

DISCLOSURE OF THE INVENTION

Problem to be Solved by the Invention

In light of the above, it is an object of the present invention to provide a ceramic composition capable of solving the above-described problem, and a method for producing the same.

Another object of the present invention is to provide a ceramic substrate formed by using the ceramic composition.

Still another object of the present invention is to provide a method for producing a ceramic green layer containing the ceramic composition.

Means for Solving the Problem

In order to solve the above technical problem, the ceramic composition according to the present invention contains:
(1) 47.0 to 67.0 wt. % in terms of $SiO_2$ of a Si component, 21.0 to 41.0 wt. % in terms of BaO of a Ba component, and 10.0 to 18.0 wt. % in terms of $Al_2O_3$ of an Al component,
(2) as a first additive, 1.0 to 5.0 parts by weight in terms of $CeO_2$ of a Ce component, relative to a total of 100 parts by weight respectively in terms of $SiO_2$, BaO and $Al_2O_3$ of the Si component, the Ba component and the Al component and
(3) as a second additive, 2.5 to 5.5 parts by weight in terms of MnO of a Mn component, relative to a total of 100 parts by weight respectively in terms of $SiO_2$, BaO, $Al_2O_3$ and $CeO_2$ of the Si component, the Ba component, the Al component and the first additive, and
(4) substantially not containing Cr.

The ceramic composition according to the present invention preferably further contains as a third additive, 0.1 to 5.0 parts by weight respectively in terms of $ZrO_2$, $TiO_2$, ZnO, $Nb_2O_5$, MgO and $Fe_2O_3$ of at least one of a Zr component, a Ti component, a Zn component, a Nb component, a Mg component and a Fe component, relative to a total of 100 parts by weight respectively in terms of $SiO_2$, BaO and $Al_2O_3$ of the Si component, the Ba component and the Al component.

The ceramic composition according to the present invention preferably further contains as a fourth additive, 0.1 to 5.0 parts by weight in terms of CoO and $V_2O_5$ of a Co component and/or a V component, relative to a total of 100 parts by weight respectively in terms of $SiO_2$, BaO and $Al_2O_3$ of the Si component, the Ba component and the Al component.

The ceramic composition according to the present invention preferably more restrictively contains 15.0 to 17.0 wt. % in terms of $Al_2O_3$ of the Al component, and 0.5 to 2.0 parts by weight, respectively, in terms of $ZrO_2$, $TiO_2$, ZnO and $Nb_2O_5$ of the third additive, relative to a total of 100 parts by weight respectively in terms of $SiO_2$, BaO and $Al_2O_3$ of the Si component, the Ba component and the Al component.

The ceramic composition according to the present invention, in another embodiment, preferably more restrictively contains 47.0 to 57.0 wt. % in terms of $SiO_2$ of the Si component, 10.0 to 15.0 wt. % in terms of $Al_2O_3$ of the Al component, and 2.0 to 4.0 parts by weight in terms of $ZrO_2$ in the case of the Zr component, 0.1 to 2.0 parts by weight in terms of $TiO_2$ in the case of the Ti component, or 0.1 to 5.0 parts by weight in terms of each of ZnO and $Nb_2O_5$ in the cases of the Zn component and the Nb component as the third additive, relative to a total of 100 parts by weight respectively in terms of $SiO_2$, BaO and $Al_2O_3$ of the Si component, the Ba component and the Al component.

The ceramic composition according to the present invention is preferably formed by mixing a calcined powder obtained by calcining the Si component, the Ba component, the Al component and the Ce component, with the Mn component that is not calcined.

The present invention is also directed to a ceramic substrate including a ceramic layer obtained by sintering the above-described ceramic composition according to the present invention.

The ceramic substrate according to the present invention preferably includes a laminate obtained by laminating a plurality of the ceramic layers, and has a predetermined conductor pattern on a superficial face and/or inside of the laminate.

The conductor pattern is preferably mainly composed of gold, silver or copper.

The present invention is also directed to a ceramic substrate having a specific structure, that is, a laminate structure including first and second superficial ceramic parts having a predetermined coefficient of thermal expansion α1 and an inner ceramic part having a coefficient of thermal expansion α2 that is larger than the coefficient of thermal expansion α1, interposed between the first and second superficial ceramic parts. In the ceramic substrate, each of the first and second superficial ceramic parts and the inner ceramic part is made from a sintered body of the ceramic composition according to the present invention.

The present invention is also directed to a method for producing a ceramic composition containing a Si component, a Ba component, an Al component, a Ce component as a first additive and a Mn component as a second additive, and substantially not containing Cr.

The production method for the ceramic composition according to the present invention includes the steps of:
(1) calcining a mixture containing 47.0 to 67.0 wt. % of $SiO_2$, 27.0 to 52.0 wt. % of $BaCO_3$, 10.0 to 18.0 wt. % of $Al_2O_3$, and 1.0 to 5.0 parts by weight of $CeO_2$ as a first additive, relative to a total of 100 parts by weight of the $SiO_2$, the $BaCO_3$ and the $Al_2O_3$, thereby preparing a calcined powder, and
(2) adding 4.0 to 9.0 parts by weight of $MnCO_3$ as a second additive, relative to a total of 100 parts by weight of the $SiO_2$, the $BaCO_3$, the $Al_2O_3$ and the first additive, to the calcined powder.

The present invention is also directed to a method for producing a ceramic green layer including a ceramic composition containing a Si component, a Ba component, an Al component, a Ce component as a first additive and a Mn component as a second additive, and substantially free of Cr. The production method for the ceramic green layer according to the present invention includes the steps of:
(1) calcining a mixture containing 47.0 to 67.0 wt. % of $SiO_2$, 27.0 to 52.0 wt. % of $BaCO_3$, 10.0 to 18.0 wt. % of $Al_2O_3$, and 1.0 to 5.0 parts by weight of $CeO_2$ as a first additive, relative to a total of 100 parts by weight of the $SiO_2$, the $BaCO_3$ and the $Al_2O_3$, thereby preparing a calcined powder,
(2) adding 4.0 to 9.0 parts by weight of $MnCO_3$ as a second additive, relative to a total of 100 parts by weight of the $SiO_2$, the $BaCO_3$, the $Al_2O_3$ and the first additive, and adding an organic binder, to the calcined powder, thereby preparing a ceramic slurry, and
(3) forming the ceramic slurry, thereby forming a ceramic green layer.

While the above "ceramic green layer" is typically prepared in the form of a ceramic green sheet, it may be a material to be a ceramic layer that is directly formed by applying a ceramic slurry, as well as the ceramic green sheet that can be handled by itself.

Effects of the Invention

According to a sintered body obtained by burning a ceramic composition of the present invention, concretely a ceramic substrate having a ceramic layer formed by sintering a ceramic composition of the present invention, a flexural strength higher than that described in Patent Document 1 can be obtained. In other words, a flexural strength which was as low as about 150 to 200 MPa in the one described in Patent Document 1 can be improved, for example, to 230 MPa or higher. This is attributable to the fact that the amount of the Al component contained in the ceramic composition according to the present invention is larger than that described in Patent Document 1.

Also, according to the ceramic composition of the present invention, since Cr is not substantially present, it is possible to prevent the Q value in the microwave band from decreasing, and to obtain a Q×f value of 1000 or higher at 3 GHz, for example.

Also, according to the ceramic composition of the present invention, since a configuration substantially not containing a B component like the one described in Patent Document 1 can be achieved, it no longer needs to use a container-like sheath in burning, and burning can be conducted on a simple tray. Therefore, the problem of variation in composition of the ceramic sintered body after burning due to variation in accuracy of the container-like sheath will not arise. Furthermore, the environment resistance against high temperature, high humidity or the like can be improved, and the chemical resistance such as an ability to inhibit elution into a plating solution, can be improved.

In the ceramic composition of the present invention, when the above-mentioned third additive and/or fourth additive is present, the flexural strength of the sintered body can be further improved.

In the ceramic composition of the present invention, when the above-described third additive is present, and the composition is selected more restrictively such that 15.0 to 17.0 wt. % in terms of $Al_2O_3$ of an Al component is contained, and as a third additive 0.5 to 2.0 parts by weight in terms of $ZrO_2$, $TiO_2$, ZnO and $Nb_2O_5$, relative to a total of 100 parts by weight in terms of $SiO_2$, BaO and $Al_2O_3$ of a Si component, a Ba component and an Al component is contained, it is possible to obtain a flexural strength of 280 MPa or higher while a Q×f value of 1000 or higher is kept at 3 GHz.

In the ceramic composition of the present invention, when the above-described third additive is present, and the composition is selected more restrictively such that 47.0 to 57.0 wt. % in terms of $SiO_2$ of a Si component is contained, 10.0 to 15.0 wt. % in terms of $Al_2O_3$ of an Al component is contained, and 2.0 to 4.0 parts by weight in terms of $ZrO_2$ in the case of a Zr component, 0.1 to 2.0 parts by weight in terms of $TiO_2$ in the case of a Ti component, or 0.1 to 5.0 parts by weight in terms of ZnO and $Nb_2O_5$ in the cases of a Zn component and a Nb component, relative to a total of 100 parts by weight respectively in terms of $SiO_2$, BaO and $Al_2O_3$ of a Si component, a Ba component and an Al component is contained as the third additive, it is possible to obtain a Q×f value of 1200 or higher at 3 GHz while a flexural strength of 230 MPa or higher is kept.

In the ceramic substrate of the present invention, when it has a conductor pattern, and the conductor pattern is mainly composed of gold, silver or copper, not only simultaneous burning with the ceramic composition of the present invention is allowed, but also electric resistance of the conductor pattern can be reduced, and the insertion loss caused by the electric resistance of the conductor pattern can be reduced.

When the ceramic substrate of the present invention has the laminate structure having the first and second superficial ceramic parts and the inner ceramic part respectively having predetermined coefficients of thermal expansion α1 and α2, respectively, compressive stress from the inner ceramic part is exerted to each of the first and second superficial ceramic parts during the cooling process after burning for production thereof, and thus the bending strength of the ceramic substrate can be improved. Since both of the first and second superficial ceramic parts and the inner ceramic part are formed of a sintered body of the ceramic composition of the present invention, the above-described advantage is also realized in the ceramic substrate.

In the production method for the ceramic composition or the production method for the ceramic green layer according to the present invention, after obtaining a calcined powder by calcining a Si component, a Ba component, an Al component and a Ce component, an uncalcined Mn component is added to the above calcined powder, so that it is possible to make the particle size of the calcined powder microscopic. Therefore, it is possible to simplify the grinding step of the calcined powder, and to readily thin the ceramic green layer produced using the same. This is because generally when a Mn component is present at the time of calcining, calcination synthesis will be promoted, but since the Mn component is not present at the time of calcining in the present invention, the calcination synthesis reaction will be inhibited.

When the Mn component is present at the time of calcining, the color of the calcined powder tends to be dark brown because oxidation of Mn ($Mn^{2+} \rightarrow Mn^{3+}$) occurs. Therefore, when a ceramic green layer is produced using such a calcined powder, the color of the ceramic green layer resembles the color of, for example, a Cu electrode, and malfunction can occur during an image recognition step. According to the present invention, however, since a Mn component is not present at the time of calcining, a cream-colored ceramic green layer can be obtained, and the above-described malfunction can be advantageously avoided.

DESCRIPTION OF THE REFERENCE SYMBOLS

| | |
|---|---|
| 1 | multi-layer ceramic substrate |
| 2 | ceramic layer |
| 3 | laminate |
| 4, 5 | external conductor film |
| 6 | internal conductor film |
| 7 | via-hole conductor |
| 21 | ceramic substrate |
| 22, 23 | superficial ceramic part |
| 24 | inner ceramic part |

BEST MODES FOR CARRYING OUT THE INVENTION

Figure 1:
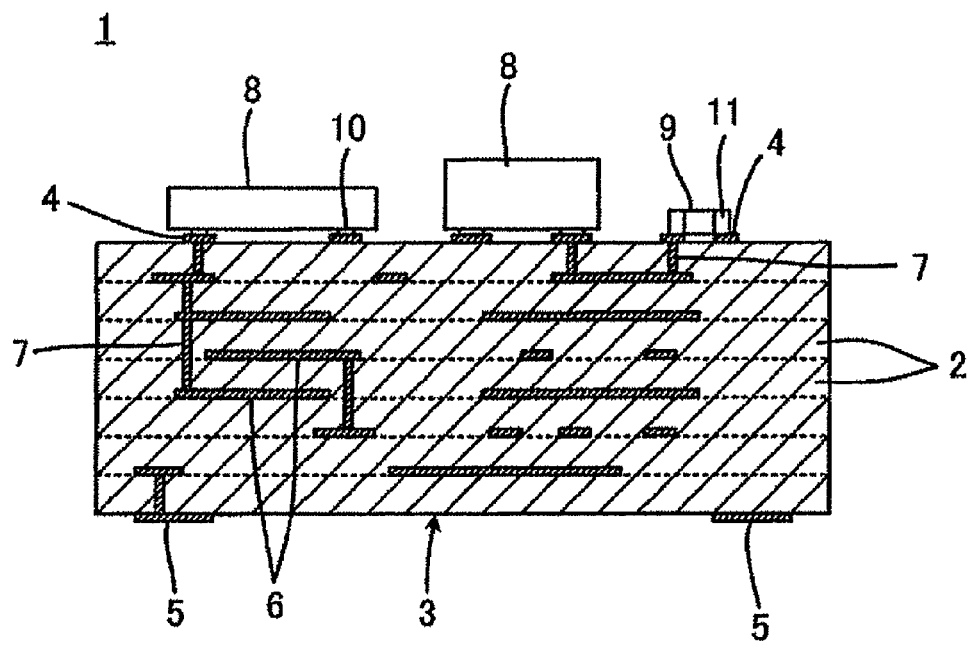
FIG. 1 is a cross-sectional view schematically showing a multi-layer ceramic substrate 1 according to a first embodiment formed by using a ceramic composition of the present invention.

FIG. 1 is a cross-sectional view schematically showing a multi-layer ceramic substrate 1 as one example of a ceramic substrate produced by using a ceramic composition of the present invention.

The multi-layer ceramic substrate 1 has a laminate 3 made up of a plurality of laminated ceramic layers 2. In the laminate 3, various conductor patterns are provided in association with specific ones of the ceramic layers 2.

As the above-described conductor patterns, there are several external conductor films 4 and 5 formed on end faces in the direction of lamination of the laminate 3, several internal conductor films 6 formed along specific interfaces between the ceramic layers 2, several via-hole conductors 7 formed to penetrate a specific one of the ceramic layers 2 and so on.

The above-described external conductor film 4 is used for connecting the laminate 3 to electronic components 8 and 9 mounted on the outer surface of the laminate 3. FIG. 1 depicts the electronic component 8 having a bump electrode 10 such as a semiconductor device, and the electronic component 9 having a planer terminal electrode 11 such as a chip capacitor.

The external conductor film 5 is used for connecting the multi-layer ceramic substrate 1 to a mother board (not shown) into which it is to be implemented.

The laminate 3 having the multi-layer ceramic substrate 1 is obtained by burning a raw laminate that includes a plurality of laminated ceramic green layers which are to become the ceramic layers 2, the internal conductor film 6 and the via-hole conductor 7 formed of a conductive paste, and optionally the external conductor films 4 and 5 formed of a conductive paste.

A laminate structure of the ceramic green layers in the above-described raw laminate is typically given by laminating a plurality of ceramic green sheets obtained by forming a ceramic slurry, and a conductor pattern, particularly an internal conductor pattern is provided in a ceramic green sheet prior to lamination.

The ceramic slurry is obtainable by preparing a slurry by adding an organic binder such as polyvinylbutylal, a solvent such as toluene or isopropyl alcohol, and a plasticizer such as di-n-butyl phthalate, and an additive such as a dispersing agent as necessary, to a ceramic composition having a composition characteristic to the present invention as will be described later.

In forming for obtaining a ceramic green sheet using a ceramic slurry, for example, the ceramic slurry is formed into a sheet on a carrier film of an organic resin such as polyethylene terephthalate by application according to the doctor blade method.

For providing a conductor pattern in a ceramic green sheet, for example, a conductive paste containing gold, silver or copper as a main ingredient of the conductive component is used, a through-hole for the via-hole conductor 7 is provided in the ceramic green sheet, while the through-hole is filled with the conductive paste, and the conductive paste film for the internal conductor film 6, and optionally conductive paste films for the external conductor films 4 and 5 are formed by, for example, a screen printing method.

Such a ceramic green sheet is laminated in a predetermined order, and compression-bonded in the direction of lamination by a pressure of 1000 kgf/cm$^2$, for example, and thereby a raw laminate is obtained.

Although not depicted, the raw laminate may be provided with a cavity for accommodating other electronic components, a joint part for securing a cover that covers the electronic components 8 and 9 and so on.

The raw laminate is burnt at a temperature that is higher than the temperature capable of sintering the ceramic composition contained in the ceramic green layer, for example, at 900° C. or higher, and equal to or lower than the melting point of the metal contained in the conductor pattern. For example, in the case of copper or gold, burning is conducted at a temperature of 1030° C. or lower.

When the metal contained in the conductor pattern is copper, burning is conducted in a non-oxidative atmosphere such as a nitrogen atmosphere, and binder removal is completed at a temperature of 900° C. or lower, and oxygen partial pressure is kept low at the time of lowering the temperature so as to substantially prevent copper from being oxidized at the completion of burning.

When the burning temperature is 980° C. or higher, for example, silver cannot be used as the metal contained in a conductor pattern but an Ag—Pd-based alloy containing 20 wt. % or more of palladium can be used. In this case, burning may be conducted in the air.

When the burning temperature is 950° C. or lower, for example, silver can be used as the metal contained in a conductor pattern.

When the burning step ends in the manner as described above, the laminate 3 shown in FIG. 1 is obtained.

Thereafter, the external conductor films 4 and 5 are formed as necessary, and the electronic components 8 and 9 are implemented, and thereby the multi-layer ceramic substrate 1 shown in FIG. 1 is completed.

The present invention may be applied not only to the multi-layer ceramic substrate including a laminate having a laminate structure as described above, but also to a ceramic substrate of a single layer structure having just one ceramic layer.

As the ceramic composition contained in the ceramic slurry described above, the one containing:
(1) 47.0 to 67.0 wt. % in terms of $SiO_2$ of a Si component, 21.0 to 41.0 wt. % in terms of BaO of a Ba component, and 10.0 to 18.0 wt. % in terms of $Al_2O_3$ of an Al component,
(2) as a first additive, 1.0 to 5.0 parts by weight in terms of $CeO_2$ of a Ce component, relative to a total of 100 parts by weight respectively in terms of $SiO_2$, BaO and $Al_2O_3$ of the Si component, the Ba component and the Al component, and
(3) as a second additive, 2.5 to 5.5 parts by weight in terms of MnO of a Mn component, relative to a total of 100 parts by weight respectively in terms of $SiO_2$, BaO, $Al_2O_3$ and $CeO_2$ of the Si component, the Ba component, the Al component and the first additive, and (4) being substantially Cr free, is used.

For further improving the flexural strength of a sintered body, namely the laminate 3 having the above-described ceramic layer 2, the one containing, as a third additive, 0.1 to 5.0 parts by weight in terms of $ZrO_2$, $TiO_2$, ZnO, $Nb_2O_5$, MgO and $Fe_2O_3$ of at least one of a Zr component, a Ti component, a Zn component, a Nb component, a Mg component and a Fe component is used.

For further improving the flexural strength of a sintered body, namely the laminate 3 having the above-described ceramic layer 2, the one containing, as a fourth additive, 0.1 to 5.0 parts by weight respectively in terms of CoO and $V_2O_5$ of a Co component and/or a V component is used. These fourth additives also function as a coloring agent.

For further improving the flexural strength of a sintered body, namely the laminate 3 having the above-described ceramic layer 2, as a ceramic composition, more restrictively, the one containing 15.0 to 17.0 wt. % in terms of $Al_2O_3$ of the Al component, and 0.5 to 2.0 parts by weight of the third additive, relative to a total of 100 parts by weight in terms of $ZrO_2$, $TiO_2$, ZnO and $Nb_2O_5$ of the Si component, the Ba component and the Al component is used.

Also, for improving the Q value, as the ceramic composition, the one more restrictively containing 47.0 to 57.0 wt. % in terms of $SiO_2$ of the Si component, 10.0 to 15.0 wt. % in terms of $Al_2O_3$ of the Al component, 2.0 to 4.0 parts by weight in terms of $ZrO_2$ in the case of a Zr component, 0.1 to 2.0 parts by weight in terms of $TiO_2$ in the case of the Ti component, or 0.1 to 5.0 parts by weight in terms of ZnO and $Nb_2O_5$ in the cases of the Zn component and the Nb component as the third additive, relative to a total of 100 parts by weight respectively in terms of $SiO_2$, BaO and $Al_2O_3$ of the Si component, the Ba component and the Al component is used.

The ceramic composition according to the present invention does not have to contain glass as a starting component as described above, and may contain glass after burning. By configuring in this manner, it is possible to produce a stable low-temperature-burnt ceramic substrate without using costly glass. Also, the ceramic composition according to the present invention does not have to contain an alkali metal. With such a configuration, environment resistance against high temperature, high humidity and the like, and chemical resistance such as the ability to inhibit elution into a plating solution can also be improved.

Preferably, the ceramic composition substantially does not contain B (boron). When B (for example, $B_2O_3$) is contained as a material component and B is a component that is prone to volatilization at the time of burning, variation can arise in composition of the sintered body, and thus in its characteristics. Since this ceramic composition substantially does not contain B, the variation during burning is small, and a sintered body (ceramic substrate) having a stable characteristic can be obtained efficiently.

The ceramic composition having the composition as described above is produced preferably through the steps of:
(1) calcining a mixture containing 47.0 to 67.0 wt. % of $SiO_2$, 27.0 to 52.0 wt. % of $BaCO_3$, 10.0 to 18.0 wt. % of $Al_2O_3$, and 1.0 to 5.0 parts by weight of $CeO_2$ as a first additive, relative to a total of 100 parts by weight of $SiO_2$, $BaCO_3$ and $Al_2O_3$, thereby preparing a calcined powder, and
(2) adding 4.0 to 9.0 parts by weight of $MnCO_3$ as a second additive, relative to a total of 100 parts by weight of $SiO_2$, $BaCO_3$, $Al_2O_3$ and the first additive, to the calcined powder.

The ceramic green layer containing the ceramic composition as described above, is preferably produced through the steps:
(1) calcining a mixture containing 47.0 to 67.0 wt. % of $SiO_2$, 27.0 to 52.0 wt. % of $BaCO_3$, 10.0 to 18.0 wt. % of $Al_2O_3$, and 1.0 to 5.0 parts by weight of $CeO_2$ as a first additive, relative to a total of 100 parts by weight of $SiO_2$, $BaCO_3$ and $Al_2O_3$, thereby preparing a calcined powder,
(2) adding 4.0 to 9.0 parts by weight of $MnCO_3$ as a second additive, relative to a total of 100 parts by weight of $SiO_2$, $BaCO_3$, $Al_2O_3$ and the first additive, and adding an organic binder, to the calcined powder, thereby preparing a ceramic slurry, and
(3) forming the ceramic slurry, thereby forming a ceramic green layer.

By adding an uncalcined Mn component to a calcined powder after obtaining the calcined powder by calcining a Si component, a Ba component, an Al component and Ce a component in the production of a ceramic composition or a ceramic green layer, a calcination synthesis reaction is inhibited during the calcination, so that the particle size of the calcined powder can be made microscopic. Therefore, it is possible to simplify the grinding step of calcined powder, and to readily proceed with thinning of the ceramic green layer produced using the same.

Also it is possible to prevent the calcined powder from turning dark brown, and thus to improve the image recognition of the ceramic green layer prepared using such a calcined powder.

The ceramic composition may further be provided with at least one of $ZrO_2$, $TiO_2$, ZnO, $Nb_2O_5$, $MgCO_3$, $Fe_2O_3$, CoO and $V_2O_5$. In this case, after preparing a calcined powder by mixing the above additive with $SiO_2$, $BaCO_3$, $Al_2O_3$ and $CeO_2$ and calcining the mixture, the calcined powder is mixed with $MnCO_3$, or the calcined powder is mixed with $MnCO_3$ and an organic binder to prepare a ceramic slurry, and then a ceramic green layer is formed. In this way, the above effect can be obtained.

In the following, test examples executed for confirming the effect produced by the present invention will be described.

TEST EXAMPLE 1

First, as starting materials, powders of $SiO_2$, $BaCO_3$, $Al_2O_3$, $CeO_2$, $MnCO_3$, $ZrO_2$, $TiO_2$, $ZnO$ and $Nb_2O_5$ each having a particle size of not more than 2.0 μm were prepared. Then these powders of starting materials were weighed so that composition proportions shown in Table 1 are satisfied after burning, wet mixed and ground, dried, and the obtained mixture was calcined at 800 to 1000° C. for 1 to 3 hours, to obtain a material powder. The above $BaCO_3$ becomes $BaO$ after burning, and the above $MnCO_2$ becomes $MnO$ after burning.

TABLE 1

| Sample No. | $SiO_2$ [wt. %] | $BaO$ [wt. %] | $Al_2O_3$ [wt. %] | $CeO_2$ [wt. %] | $ZrO_2$ [wt. %] | $TiO_2$ [wt. %] | $ZnO$ [wt. %] | $Nb_2O_5$ [wt. %] | $MnO$ [wt. %] |
|---|---|---|---|---|---|---|---|---|---|
| 1* | 46.0 | 40.0 | 14.0 | 3.0 | 0.5 | — | — | — | 4.0 |
| 2 | 47.0 | 40.0 | 13.0 | 3.0 | 0.5 | — | — | — | 4.0 |
| 3 | 48.0 | 40.0 | 12.0 | 3.0 | 0.5 | — | — | — | 4.0 |
| 4 | 57.0 | 31.0 | 12.0 | 3.0 | 0.5 | — | — | — | 4.0 |
| 5 | 66.0 | 22.0 | 12.0 | 3.0 | 0.5 | — | — | — | 4.0 |
| 6 | 67.0 | 22.0 | 11.0 | 3.0 | 0.5 | — | — | — | 4.0 |
| 7* | 68.0 | 22.0 | 10.0 | 3.0 | 0.5 | — | — | — | 4.0 |
| 8* | 66.0 | 20.0 | 14.0 | 3.0 | 0.5 | — | — | — | 4.0 |
| 9 | 63.0 | 20.0 | 17.0 | 3.0 | 0.5 | — | — | — | 4.0 |
| 10 | 48.0 | 41.0 | 11.0 | 3.0 | 0.5 | — | — | — | 4.0 |
| 11* | 48.0 | 42.0 | 10.0 | 3.0 | 0.5 | — | — | — | 4.0 |
| 12* | 62.0 | 31.0 | 7.0 | 3.0 | 0.5 | — | — | — | 4.0 |
| 13* | 60.0 | 31.0 | 9.0 | 3.0 | 0.5 | — | — | — | 4.0 |
| 14 | 59.0 | 31.0 | 10.0 | 3.0 | 0.5 | — | — | — | 4.0 |
| 15 | 54.0 | 31.0 | 15.0 | 3.0 | 0.5 | — | — | — | 4.0 |
| 16 | 52.0 | 31.0 | 17.0 | 3.0 | 0.5 | — | — | — | 4.0 |
| 17 | 51.0 | 31.0 | 18.0 | 3.0 | 0.5 | — | — | — | 4.0 |
| 18* | 50.0 | 31.0 | 19.0 | 3.0 | 0.5 | — | — | — | 4.0 |
| 19* | 57.0 | 31.0 | 12.0 | — | 0.5 | — | — | — | 4.0 |
| 20* | 57.0 | 31.0 | 12.0 | 0.5 | 0.5 | — | — | — | 4.0 |
| 21 | 57.0 | 31.0 | 12.0 | 1.0 | 0.5 | — | — | — | 4.0 |
| 22 | 57.0 | 31.0 | 12.0 | 2.0 | 0.5 | — | — | — | 4.0 |
| 23 | 57.0 | 31.0 | 12.0 | 4.0 | 0.5 | — | — | — | 4.0 |
| 24 | 57.0 | 31.0 | 12.0 | 5.0 | 0.5 | — | — | — | 4.0 |
| 25* | 57.0 | 31.0 | 12.0 | 6.0 | 0.5 | — | — | — | 4.0 |
| 26 | 57.0 | 31.0 | 12.0 | 3.0 | — | — | — | — | 4.0 |
| 27 | 57.0 | 31.0 | 12.0 | 3.0 | 0.1 | — | — | — | 4.0 |
| 28 | 57.0 | 31.0 | 12.0 | 3.0 | 2.0 | — | — | — | 4.0 |
| 29 | 57.0 | 31.0 | 12.0 | 3.0 | 4.0 | — | — | — | 4.0 |
| 30 | 57.0 | 31.0 | 12.0 | 3.0 | 5.0 | — | — | — | 4.0 |
| 31Δ | 57.0 | 31.0 | 12.0 | 3.0 | 6.0 | — | — | — | 4.0 |
| 32 | 57.0 | 31.0 | 12.0 | 3.0 | — | 0.1 | — | — | 4.0 |
| 33 | 57.0 | 31.0 | 12.0 | 3.0 | — | 0.5 | — | — | 4.0 |
| 34 | 57.0 | 31.0 | 12.0 | 3.0 | — | 2.0 | — | — | 4.0 |
| 35 | 57.0 | 31.0 | 12.0 | 3.0 | — | 4.0 | — | — | 4.0 |
| 36 | 57.0 | 31.0 | 12.0 | 3.0 | — | 5.0 | — | — | 4.0 |
| 37Δ | 57.0 | 31.0 | 12.0 | 3.0 | — | 6.0 | — | — | 4.0 |
| 38 | 57.0 | 31.0 | 12.0 | 3.0 | — | — | 0.1 | — | 4.0 |
| 39 | 57.0 | 31.0 | 12.0 | 3.0 | — | — | 0.5 | — | 4.0 |
| 40 | 57.0 | 31.0 | 12.0 | 3.0 | — | — | 2.0 | — | 4.0 |
| 41 | 57.0 | 31.0 | 12.0 | 3.0 | — | — | 4.0 | — | 4.0 |
| 42 | 57.0 | 31.0 | 12.0 | 3.0 | — | — | 5.0 | — | 4.0 |
| 43Δ | 57.0 | 31.0 | 12.0 | 3.0 | — | — | 6.0 | — | 4.0 |
| 44 | 57.0 | 31.0 | 12.0 | 3.0 | — | — | — | 0.1 | 4.0 |
| 45 | 57.0 | 31.0 | 12.0 | 3.0 | — | — | — | 0.5 | 4.0 |
| 46 | 57.0 | 31.0 | 12.0 | 3.0 | — | — | — | 2.0 | 4.0 |
| 47 | 57.0 | 31.0 | 12.0 | 3.0 | — | — | — | 4.0 | 4.0 |
| 48 | 57.0 | 31.0 | 12.0 | 3.0 | — | — | — | 5.0 | 4.0 |
| 49Δ | 57.0 | 31.0 | 12.0 | 3.0 | — | — | — | 6.0 | 4.0 |
| 50* | 57.0 | 31.0 | 12.0 | 3.0 | 0.5 | — | — | — | 2.0 |
| 51 | 57.0 | 31.0 | 12.0 | 3.0 | 0.5 | — | — | — | 2.5 |
| 52 | 57.0 | 31.0 | 12.0 | 3.0 | 0.5 | — | — | — | 5.0 |
| 53 | 57.0 | 31.0 | 12.0 | 3.0 | 0.5 | — | — | — | 5.5 |
| 54* | 57.0 | 31.0 | 12.0 | 3.0 | 0.5 | — | — | — | 6.0 |
| 55 | 57.0 | 31.0 | 12.0 | 3.0 | 0.2 | 0.2 | — | — | 4.0 |
| 56 | 57.0 | 31.0 | 12.0 | 3.0 | 0.2 | — | 0.2 | — | 4.0 |
| 57 | 57.0 | 31.0 | 12.0 | 3.0 | 0.2 | — | — | 0.2 | 4.0 |

In Table 1, $SiO_2$, $BaO$ and $Al_2O_3$ are represented by "wt. %", and a total of these is 100 wt. %. On the other hand, $CeO_2$, $ZrO_2$, $TiO_2$, $ZnO$, $Nb_2O_5$ and $MnO$ are represented by "parts by weight". As for $CeO_2$, $ZrO_2$, $TiO_2$, $ZnO$ and $Nb_2O_5$, they are represented by a weight ratio, relative to a total of 100 parts by weight of $SiO_2$, $BaO$ and $Al_2O_3$, and as for $MnO$, it is represented by a weight ratio, relative to a total of 100 parts by weight of $SiO_2$, $BaO$, $Al_2O_3$ and $CeO_2$.

Next, the material powder according to each sample as described above was combined with appropriate amounts of an organic binder, a dispersing agent and a plasticizer, to prepare a ceramic slurry, and then the slurry was mixed and ground so that the powder particle size in the slurry was not more than 1.5 μm.

The resulting ceramic slurry was formed into a sheet by a doctor blade method, dried and cut into an appropriate size, to obtain a ceramic green sheet having a thickness of 50 μm.

Next, the obtained ceramic green sheet was cut into a predetermined size, laminated, and then compression-bonded under heating under the condition of a temperature ranging from 60 to 80° C. and a pressure of 1000 to 1500 kg/cm², to obtain a raw laminate.

Next, the raw laminate was burnt at a temperature ranging from 900 to 1000° C. in a non-oxidative atmosphere of nitrogen-hydrogen, to obtain a plate-like sample of a ceramic sintered body.

For the obtained sample, the dielectric constant $\epsilon_r$ and Q at 3 GHz were measured by a perturbation method, and as for Q, a Q×f value was determined by multiplication with the resonance frequency f. Also, the insulation resistance (ρ) at DC 100 V was measured, and log ρ was determined. Further, by the three-point flexural strength test (JIS-R1061), the flexural strength was measured.

These evaluation results are shown in Table 2.

TABLE 2

| Sample No. | $\epsilon_r$ | Q × f [GHz] | Insulation resistance [logρ] | Flexural strength [MPa] |
|---|---|---|---|---|
| 1* | 7.3 | 1300 | 12 | 210* |
| 2 | 7.2 | 1350 | 12 | 240 |
| 3 | 7.1 | 1400 | 12 | 240 |
| 4 | 6.7 | 1300 | 12 | 310 |
| 5 | 6.5 | 1100 | 12 | 250 |
| 6 | 6.2 | 1000 | 12 | 250 |
| 7* | 6.4 | 900* | 12 | 230 |
| 8* |  | Unsintered* |  |  |
| 9 | 6.6 | 1200 | 12 | 280 |
| 10 | 6.5 | 1300 | 12 | 240 |
| 11* | 6.5 | 1300 | 12 | 190* |
| 12* | 6.4 | 1000 | 12 | 220* |
| 13* | 6.4 | 1100 | 12 | 220* |
| 14 | 6.4 | 1200 | 12 | 240 |
| 15 | 6.9 | 1300 | 12 | 280 |
| 16 | 7.4 | 1100 | 12 | 310 |
| 17 | 7.5 | 1100 | 12 | 270 |
| 18* |  | Unsintered* |  |  |
| 19* |  | Unsintered* |  |  |
| 20* | 6.5 | 1000 | 12 | 190* |
| 21 | 6.5 | 1000 | 12 | 240 |
| 22 | 6.7 | 1200 | 12 | 250 |
| 23 | 6.7 | 1100 | 12 | 260 |
| 24 | 6.7 | 1100 | 13 | 240 |
| 25* | 6.8 | 900* | 13 | 220* |
| 26 | 6.7 | 1100 | 12 | 230 |
| 27 | 6.7 | 1100 | 12 | 250 |
| 28 | 6.7 | 1400 | 12 | 280 |
| 29 | 6.7 | 1200 | 12 | 240 |
| 30 | 6.8 | 1100 | 12 | 240 |
| 31Δ | 6.8 | 1100 | 12 | 230 |
| 32 | 6.6 | 1200 | 12 | 250 |
| 33 | 6.6 | 1300 | 12 | 330 |
| 34 | 6.6 | 1200 | 13 | 300 |
| 35 | 6.5 | 1100 | 13 | 250 |
| 36 | 6.5 | 1100 | 13 | 240 |
| 37Δ | 6.5 | 1000 | 13 | 230 |
| 38 | 6.7 | 1200 | 12 | 240 |
| 39 | 6.7 | 1400 | 12 | 300 |
| 40 | 6.7 | 1400 | 12 | 280 |
| 41 | 6.7 | 1300 | 12 | 250 |
| 42 | 6.6 | 1200 | 12 | 240 |
| 43Δ | 6.5 | 1100 | 12 | 230 |
| 44 | 6.7 | 1200 | 13 | 240 |
| 45 | 6.7 | 1400 | 13 | 300 |
| 46 | 6.8 | 1300 | 13 | 310 |
| 47 | 6.8 | 1200 | 13 | 250 |
| 48 | 6.8 | 1200 | 13 | 240 |
| 49Δ | 6.9 | 1100 | 13 | 230 |
| 50* |  | Unsintered* |  |  |
| 51 | 6.7 | 1000 | 12 | 240 |
| 52 | 6.6 | 1200 | 13 | 260 |
| 53 | 6.6 | 1100 | 13 | 240 |
| 54* | 6.6 | 1100 | 13 | 210* |
| 55 | 6.7 | 1200 | 12 | 270 |
| 56 | 6.7 | 1300 | 12 | 260 |
| 57 | 6.8 | 1200 | 12 | 260 |

In Table 2 and Table 1 above, for samples outside the scope of the present invention, the sample number is marked with "*". In Table 2, samples with an evaluation result which is a cause of deviation from the scope of the present invention is also marked with "*". Further, in Table 2 and the above Table 1, the samples within the scope of the present invention but which depart from the more preferred scope is marked with "Δ".

Referring to Table 1 and Table 2, Sample Nos. 2 to 6, 9, 10, 14 to 17, 21 to 24, 26 to 49, 51 to 53, and 55 to 57 satisfy the following requirements:

(1) $SiO_2$ is contained at 47.0 to 67.0 wt. %, BaO is contained at 21.0 to 41.0 wt. %, and $Al_2O_3$ is contained at 10.0 to 18.0 wt. %, (2) $CeO_2$ as a first additive is contained at 1.0 to 5.0 parts by weight, relative to a total of 100 parts by weight of $SiO_2$, BaO and $Al_2O_3$, (3) MnO as a second additive is contained at 2.5 to 5.5 parts by weight, relative to a total of 100 parts by weight of $SiO_2$, BaO, $Al_2O_3$ and $CeO_2$, and (4) Cr is not contained, are within the scope of the present invention, and show an excellent flexural strength of 230 MPa or higher and a Q×f value of 1000 or higher.

Among the samples within the scope of the present invention, Samples 2 to 6, 9, 10, 14 to 17, 21 to 24, 27 to 49, 51 to 53, and 55 to 57 that contain 0.1 to 5 parts by weight of at least one of $ZrO_2$, $TiO_2$, ZnO and $Nb_2O_5$ as a third additive, relative to a total of 100 parts by weight of $SiO_2$, BaO and $Al_2O_3$, exhibit an excellent flexural strength of 240 MPa or higher.

Although the effect of the present invention is obtained even without the third additive, sintering performance improves, the Q value improves, and when the range is 0.1 to 5 wt. %, in particular, the flexural strength is 240 MPa or higher when at least one of $ZrO_2$, $TiO_2$, ZnO and $Nb_2O_5$ is present. However, when more than 5 wt. % is included as in Samples 31, 37, 43 and 49 marked with "Δ", the flexural strength tends not to improve.

Samples 9, 15 and 16 satisfy the more restrictive requirements that $Al_2O_3$ is contained at 15.0 to 17.0 wt. %, and at least one of $ZrO_2$, $TiO_2$, ZnO and $Nb_2O_5$ as a third additive is contained at 0.5 to 2.0 parts by weight, a flexural strength of 280 MPa or larger is obtained, and a more desirable result is obtained.

Samples 28, 29, 32 to 34, 38 to 42, and 44 to 48 satisfy the more restrictive requirements that $SiO_2$ is present at 47.0 to 57.0 wt. %, and $Al_2O_3$ is present at 10.0 to 15.0 wt. %, and when $ZrO_2$ is present as a third additive, it is 2.0 to 4.0 parts by weight, when $TiO_2$ is present, it is 0.1 to 2.0 parts by weight, when ZnO is present, it is 0.1 to 5.0 parts by weight, and when $Nb_2O_5$ is present, it is 0.1 to 5.0 parts by weight, a Q×f value of 1200 or higher is obtained, and a more favorable result is obtained.

In contrast to these, when $SiO_2$ is present at less than 47.0 wt. % as is the case of Sample 1, the flexural strength is less than 230 MPa. On the other hand, when $SiO_2$ is present at more than 67.0 wt. % as is the case of Sample 7, the Q×f value is less than 1000.

When BaO is present at less than 21.0 wt. % as is the case of Sample 8, sintering will not be achieved at a burning temperature of 1000° C. or lower. On the other hand, when BaO is present at more than 41.0 wt. % as is the case of Sample 11, the flexural strength is less than 230 MPa.

When $Al_2O_3$ is present at less than 10.0 wt. % as is the cases of Samples 12 and 13, the flexural strength is less than 230 MPa. On the other hand, when $Al_2O_3$ is present at more than 17.0 wt. % as is the case of Sample 18, sintering will not be achieved at a burning temperature of 1000° C. or lower.

When $CeO_2$ is not present as is the case of Sample 19, sintering will not be achieved at a burning temperature of 1000° C. or lower. Even when $CeO_2$ is present, with less than 1.0 part by weight as is the case of Sample 20, the flexural strength is less than 230 MPa. On the other hand, when $CeO_2$ is present at more than 5.0 parts by weight as is the case of Sample 25, the Q×f value is less than 1000, and the flexural strength is less than 230 MPa.

When MnO is contained at less than 2.5 parts by weight as is the case of Sample 50, sintering will not be achieved at a burning temperature of 1000° C. or lower. On the other hand, when MnO is contained at more than 5.5 parts by weight as is the case of Sample 54, the flexural strength is less than 230 MPa.

TEST EXAMPLE 2

First, as starting materials, powders of $SiO_2$, $BaCO_3$, $Al_2O_3$, $CeO_2$, $MnCO_3$, $ZrO_2$, $MgCO_3$, $Fe_2O_3$, CoO and $V_2O_5$ each having a particle size of not more than 2.0 μm were prepared. Then these powders of starting materials were weighed so that composition proportions shown in Table 3 are satisfied after burning, wet mixed and ground, dried, and the obtained mixture was calcined at 800 to 1000° C. for 1 to 3 hours, to obtain a material powder. The above $BaCO_3$ becomes BaO after burning, and the above $MgCO_3$ becomes MgO after burning.

TABLE 3

| Sample No. | $SiO_2$ [wt. %] | BaO [wt. %] | $Al_2O_3$ [wt. %] | $CeO_2$ [wt. %] | $ZrO_2$ [wt. %] | MgO [wt. %] | $Fe_2O_3$ [wt. %] | CoO [wt. %] | $V_2O_5$ [wt. %] | MnO [wt. %] |
|---|---|---|---|---|---|---|---|---|---|---|
| 101 | 57.0 | 31.0 | 12.0 | 3.0 | — | 0.1 | — | — | — | 4.0 |
| 102 | 57.0 | 31.0 | 12.0 | 3.0 | — | 0.5 | — | — | — | 4.0 |
| 103 | 57.0 | 31.0 | 12.0 | 3.0 | — | 2.0 | — | — | — | 4.0 |
| 104 | 57.0 | 31.0 | 12.0 | 3.0 | — | 4.0 | — | — | — | 4.0 |
| 105 | 57.0 | 31.0 | 12.0 | 3.0 | — | 5.0 | — | — | — | 4.0 |
| 106Δ | 57.0 | 31.0 | 12.0 | 3.0 | — | 6.0 | — | — | — | 4.0 |
| 107 | 57.0 | 31.0 | 12.0 | 3.0 | — | — | 0.1 | — | — | 4.0 |
| 108 | 57.0 | 31.0 | 12.0 | 3.0 | — | — | 0.5 | — | — | 4.0 |
| 109 | 57.0 | 31.0 | 12.0 | 3.0 | — | — | 2.0 | — | — | 4.0 |
| 110 | 57.0 | 31.0 | 12.0 | 3.0 | — | — | 4.0 | — | — | 4.0 |
| 111 | 57.0 | 31.0 | 12.0 | 3.0 | — | — | 5.0 | — | — | 4.0 |
| 112Δ | 57.0 | 31.0 | 12.0 | 3.0 | — | — | 6.0 | — | — | 4.0 |
| 113 | 57.0 | 31.0 | 12.0 | 3.0 | 0.5 | — | — | 0.1 | — | 4.0 |
| 114 | 57.0 | 31.0 | 12.0 | 3.0 | 0.5 | — | — | 0.5 | — | 4.0 |
| 115 | 57.0 | 31.0 | 12.0 | 3.0 | 0.5 | — | — | 2.0 | — | 4.0 |
| 116 | 57.0 | 31.0 | 12.0 | 3.0 | 0.5 | — | — | 4.0 | — | 4.0 |
| 117 | 57.0 | 31.0 | 12.0 | 3.0 | 0.5 | — | — | 5.0 | — | 4.0 |
| 118Δ | 57.0 | 31.0 | 12.0 | 3.0 | 0.5 | — | — | 6.0 | — | 4.0 |
| 119 | 57.0 | 31.0 | 12.0 | 3.0 | 0.5 | — | — | — | 0.1 | 4.0 |
| 120 | 57.0 | 31.0 | 12.0 | 3.0 | 0.5 | — | — | — | 0.5 | 4.0 |
| 121 | 57.0 | 31.0 | 12.0 | 3.0 | 0.5 | — | — | — | 2.0 | 4.0 |
| 122 | 57.0 | 31.0 | 12.0 | 3.0 | 0.5 | — | — | — | 4.0 | 4.0 |
| 123 | 57.0 | 31.0 | 12.0 | 3.0 | 0.5 | — | — | — | 5.0 | 4.0 |
| 124Δ | 57.0 | 31.0 | 12.0 | 3.0 | 0.5 | — | — | — | 6.0 | 4.0 |

In Table 3, $SiO_2$, $BaO_3$ and $Al_2O_3$ are represented by "wt. %", and a total of these is 100 wt. %. On the other hand, $CeO_2$, $ZrO_2$, MgO, $Fe_2O_3$, CoO, $V_2O_5$ and MnO are represented by "parts by weight". As for $CeO_2$, $ZrO_2$, MgO, $Fe_2O_3$, CoO and $V_2O_5$, they are represented by a weight ratio, relative to a total of 100 parts by weight of $SiO_2$, BaO and $Al_2O_3$, and as for MnO, it is represented by a weight ratio, relative to a total of 100 parts by weight of $SiO_2$, BaO, $Al_2O_3$ and $CeO_2$.

Next, according to a processing procedure similar to that in Test example 1, a ceramic slurry was prepared using the material powder according to each of the above samples, and the ceramic slurry was formed into a sheet by a doctor blade method, to obtain a ceramic green sheet having a thickness of 50 μm.

In a similar manner as in Test example 1, a raw laminate was fabricated from the obtained ceramic green sheet, and the laminate was burnt, to obtain a plate-like ceramic sintered body.

Next, evaluation of the obtained samples similar to that in Test example 1 was conducted. The evaluation result is shown in Table 4.

TABLE 4

| Sample No. | $\epsilon_r$ | Q × f [GHz] | Insulation resistance [logρ] | Flexural strength [MPa] |
|---|---|---|---|---|
| 101 | 6.7 | 1350 | 13 | 310 |
| 102 | 6.6 | 1500 | 14 | 300 |
| 103 | 6.5 | 1550 | 14 | 310 |
| 104 | 6.5 | 1500 | 14 | 290 |
| 105 | 6.6 | 1500 | 14 | 300 |
| 106Δ | 6.7 | 1300 | 14 | 280 |
| 107 | 6.9 | 1300 | 13 | 300 |
| 108 | 7.2 | 1200 | 13 | 320 |
| 109 | 7.3 | 1100 | 12 | 330 |

TABLE 4-continued

| Sample No. | $\epsilon_r$ | Q × f [GHz] | Insulation resistance [logρ] | Flexural strength [MPa] |
|---|---|---|---|---|
| 110 | 7.3 | 1150 | 12 | 320 |
| 111 | 7.5 | 1100 | 12 | 320 |
| 112Δ | 7.5 | 1050 | 12 | 300 |
| 113 | 6.7 | 1300 | 13 | 310 |
| 114 | 6.7 | 1250 | 13 | 310 |
| 115 | 6.7 | 1300 | 13 | 320 |
| 116 | 6.7 | 1200 | 12 | 310 |
| 117 | 6.7 | 1150 | 12 | 310 |
| 118Δ | 6.7 | 1100 | 12 | 280 |
| 119 | 6.9 | 1300 | 12 | 300 |
| 120 | 6.9 | 1100 | 12 | 310 |
| 121 | 7.2 | 1150 | 12 | 310 |
| 122 | 7.2 | 1150 | 12 | 320 |
| 123 | 7.3 | 1100 | 12 | 310 |
| 124Δ | 7.5 | 1050 | 12 | 290 |

In Table 4 and the above Table 3, a sample that is within the scope of the present invention but departs from the more preferred scope is marked with "Δ".

Referring to Table 3 and Table 4, all of the Samples 101 to 124 satisfy the following requirements:
(1) $SiO_2$ is present at 47.0 to 67.0 wt. %, BaO is present at 21.0 to 41.0 wt. %, and $Al_2O_3$ is present at 10.0 to 18.0 wt. %,
(2) $CeO_2$ as a first additive is present at 1.0 to 5.0 parts by weight, relative to a total of 100 parts by weight of $SiO_2$, BaO and $Al_2O_3$,
(3) MnO as a second additive is present at 2.5 to 5.5 parts by weight, relative to a total of 100 parts by weight of $SiO_2$, BaO, $Al_2O_3$ and $CeO_2$, and
(4) Cr is not present. These Samples 101 to 124 are within the scope of the present invention, and show an excellent flexural strength of 280 MPa or higher and a Q×f value of 1000 or higher.

Among the samples within the scope of the present invention, Samples 101 to 105, 107 to 111, 113 to 117, and 119 to 123 that contain 0.1 to 5 parts by weight of at least one of $ZrO_2$, MgO and $Fe_2O_3$ as a third additive, relative to a total of 100 parts by weight of $SiO_2$, BaO and $Al_2O_3$ exhibit an excellent flexural strength of 290 MPa or higher.

Although the effect of the present invention is obtained even without the third additive, when at least one of $ZrO_2$, MgO and $Fe_2O_3$ is present, the performance improves, the Q value improves, and when the range is 0.1 to 5 wt. %, in particular, the flexural strength is 290 MPa or higher. However, when 5 wt. % or larger is contained as in Samples 106, 112, 118 and 124 marked with "Δ", the flexural strength tends not to improve.

TEST EXAMPLE 3

As starting materials, powders of $SiO_2$, $BaCO_3$, $Al_2O_3$, $CeO_2$, $ZrO_2$, $TiO_2$, $Nb_2O_5$ and $MnCO_3$ each having a particle size of not more than 2.0 μm were prepared. Then these powders of starting materials were weighed so that $SiO_2$ was 57 wt. %, $BaCO_3$ was 31 wt. %, $Al_2O_3$ was 12 wt. %, and $CeO_2$ was 3 parts by weight, $ZrO_2$ was 0.5 part by weight, $TiO_2$ was 0.5 part by weight, $Nb_2O_5$ was 0.5 part by weight and $MnCO_3$ was 6.5 parts by weight, relative to a total of 100 parts by weight of $SiO_2$, $BaCO_3$ and $Al_2O_3$.

Next, for examples within the scope of the present invention, powders of $SiO_2$, $BaCO_3$, $Al_2O_3$, $CeO_2$, $ZrO_2$, $TiO_2$, and $Nb_2O_5$ (but not $MnCO_3$) were wet mixed and ground, dried, and the obtained mixture was calcined for two hours at each temperature of 800° C., 840° C. and 880° C. to obtain a calcined powder.

On the other hand, in comparative examples outside the scope of the present invention, every powder of $SiO_2$, $BaCO_3$, $Al_2O_3$, $CeO_2$, $ZrO_2$, $TiO_2$, $Nb_2O_5$ and $MnCO_3$ were wet mixed and ground, dried, and the obtained mixture was calcined for two hours at each temperature of 800° C., 840° C. and 880° C. to obtain a calcined powder.

For each calcined powder of examples and comparative examples obtained in this manner, the particle size (D50) was measured, and the result is shown in Table 5 below.

TABLE 5

| | Calcining temperature | | |
|---|---|---|---|
| | 800° C. | 840° C. | 880° C. |
| Example | 0.60 μm | 0.76 μm | 0.89 μm |
| Comparative Example | 0.79 μm | 0.95 μm | 1.21 μm |

From Table 5, it was revealed that the particle size of the calcined powder can be made smaller, compared to the comparative examples.

TEST EXAMPLE 4

To 100 parts by weight of the calcined powder according to the example obtained in Test example 3, 6.5 parts by weight of a $MnCO_3$ powder, 14 parts by weight of an organic binder, 2.6 parts by weight of a dispersing agent, and 6 parts by weight of a plasticizer were added, and mixed, to obtain a ceramic slurry. Then the ceramic slurry was formed into a sheet by the doctor blade method, and dried, to obtain a ceramic green sheet according to the example. This ceramic green sheet was cream in color.

On the other hand, to 100 parts by weight of the calcined powder according to the comparative example obtained in Test example 3, 14 parts by weight of an organic binder, 2.6 parts by weight of a dispersing agent, and 6 parts by weight of a plasticizer were added, and mixed, to obtain a ceramic slurry. Then the ceramic slurry was formed into a sheet by the doctor blade method, and dried, to obtain a ceramic green sheet according to the comparative example. This ceramic green sheet was dark brown in color.

By printing a conductive paste containing Cu as a conductive component, on a ceramic green sheet according to each of the above example and comparative example, a mark of 1 mm×1 mm was provided, and an image of the mark was taken by a camera.

As a result, the image of the mark was clearly recognized in the ceramic green sheet according to the example, however, the image of the mark was difficult to be recognized in the ceramic green sheet according to the comparative example.

Figure 2:
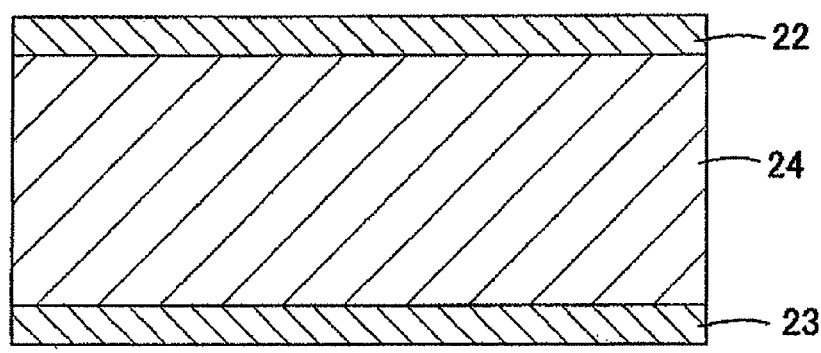
FIG. 2 is a cross-sectional view schematically showing a ceramic substrate 21 according to a second embodiment formed by using a ceramic composition of the present invention.

FIG. 2 is a cross-sectional view schematically showing a ceramic substrate 21 according to the second embodiment formed by using the ceramic composition of the present invention.

The ceramic substrate 21 has a laminate structure including first and second superficial ceramic parts 22 and 23 having a predetermined coefficient of thermal expansion α1, and an inner ceramic part 24 having a coefficient of thermal expansion α2 which is larger than the coefficient of thermal expansion α1, interposed between the first and second superficial ceramic parts 22 and 23.

In the ceramic substrate 21, each of the first and second superficial ceramic parts 22 and 23 and the inner ceramic part 24 is formed of a sintered body of the ceramic composition according to the present invention.

By selecting the coefficient of thermal expansion α1 of the first and second superficial ceramic parts 22 and 23 and the coefficient of thermal expansion α2 of the inner ceramic part 24 of ceramic substrate 21 to satisfy the above relationship, compressive stress from the inner ceramic part 24 is exerted on the first and second superficial ceramic parts 22 and 23 during cooling after the burning step executed for producing the ceramic substrate 21. As a result, it is possible to improve the bending strength of the ceramic substrate 21.

For securely achieving the operational effect as described above, the difference between the coefficient of thermal expansion α1 and the coefficient of thermal expansion α2 is preferably 0.5 ppm/° C. or more, and the thickness of each of the superficial ceramic parts 22 and 23 is preferably 150 μm or less.

Since each of the first and second superficial ceramic parts 22 and 23 and the inner ceramic part 24 is formed of a sintered body of the ceramic composition according to the present invention, burning can be conducted at a relatively low temperature and the ceramic substrate 21 having an excellent high-frequency characteristic can be obtained. Further, since the superficial ceramic parts 22 and 23 and the inner ceramic part 24 are formed of ceramic sintered bodies having substantially the same composition, even when they have different coefficients of thermal expansion as described above, the occurrence of cracks and warpage can be prevented, and a ceramic substrate 21 having excellent reliability can be obtained.

In FIG. 2, the illustration of a conductor pattern provided in association with the ceramic substrate 21 is omitted. As possible conductor patterns, there are an internal conductor film, a via-hole conductor and the like provided inside the ceramic substrate 21, as well as an external conductor film provided on the outer surface of the ceramic substrate 21.

When an internal conductor film or a via-hole conductor is provided, it is usual that each of the superficial ceramic parts 22 and 23 included in the ceramic substrate 21 has a laminate structure made up of a plurality of layers, or the inner ceramic part 24 has a laminate structure made up of a plurality of layers. Illustration of these laminate structures is also omitted in FIG. 2.

Next, a test example executed for confirming the effect by a specific configuration included in the ceramic substrate 21 shown in FIG. 2 will be described.

TEST EXAMPLE 5

The first and second superficial ceramic parts 22 and 23 were formed of the composition according to Sample 30 in the above Test example 1, the inner ceramic part 24 was formed of the composition according to Sample 48 in Test example 1, and a burning step was executed under the condition that the superficial ceramic parts 22 and 23 and the inner ceramic part 24 were laminated, to obtain the ceramic substrate 21 which was to be a sample.

In the ceramic substrate 21, the thickness of each of the first and second superficial ceramic parts 22 and 23 was 70 μm, and the thickness of the inner ceramic part 24 was 860 μm. Therefore, the requirement that the thickness of each of the superficial ceramic parts 22 and 23 is 150 μm or less is satisfied.

The coefficient of thermal expansion of the sintered body of the ceramic composition according to Sample 30 is 10.5 ppm/° C. On the other hand, the coefficient of thermal expansion of the sintered body of the ceramic composition according to Sample 48 is 12.0 ppm/° C. Therefore, the requirement that the coefficient of thermal expansion α2 of the inner ceramic part 24 is larger than the coefficient of thermal expansion α1 of the superficial ceramic parts 22 and 23 is satisfied, and also the requirement that the difference between the coefficient of thermal expansion α1 and the coefficient of thermal expansion α2 is 0.5 ppm/° C. or larger is satisfied.

The bending strength of the obtained ceramic substrate 21 was measured, and it was 350 MPa. On the other hand, as shown in Table 2, the bending strength by Sample 30 alone was 240 MPa, and the bending strength by Sample 48 alone was 240 MPa. This reveals that the bending strength of the ceramic substrate 21 is improved compared to each of the superficial ceramic parts 22 and 23 and the inner ceramic part 24 alone.

The invention claimed is:

1. A ceramic composition comprising:
   47.0 to 67.0 wt. % of a Si component,
   21.0 to 41.0 wt. % of a Ba component, and
   10.0 to 18.0 wt. % of an Al component,
   as a first additive, 1.0 to 5.0 parts by weight of a Ce component, relative to a total of 100 parts by weight of the Si, Ba and Al components and
   as a second additive, 2.5 to 5.5 parts by weight of a Mn component, relative to a total of 100 parts by weight of the Si, Ba, Al components and the first additive, and
   being substantially free of Cr,
   wherein said Si, Ba, Al, Ce, and components are calculated in terms of $SiO_2$, $BaO$, $Al_2O_3$, $CeO_2$, and $MnO$, respectively.

2. The ceramic composition according to claim 1, further comprising as a third additive, 0.1 to 5.0 parts by weight of at least one of a Zr component, a Ti component, a Zn component, a Nb component, a Mg component and a Fe component, calculated in terms of $ZrO_2$, $TiO_2$, $ZnO$, $Nb_2O_5$, $MgO$ and $Fe_2O_3$, respectively, relative to a total of 100 parts by weight of the Si, Ba and Al components.

3. The ceramic composition according to claim 2, wherein the third additive comprises a Zr component.

4. The ceramic composition according to claim 3, further comprising as a fourth additive, 0.1 to 5.0 parts by weight of at least one of a Co component and a V component calculated in terms of $CoO$ and $V_2O_5$, relative to a total of 100 parts by weight of the Si, Ba and Al components.

5. The ceramic composition according to claim 2, further comprising as a fourth additive, 0.1 to 5.0 parts by weight of at least one of a Co component and a V component calculated in terms of $CoO$ and $V_2O_5$, relative to a total of 100 parts by weight of the Si, Ba and Al components.

6. The ceramic composition according to claim 1, further comprising as a fourth additive, 0.1 to 5.0 parts by weight of at least one of a Co component and a V component calculated in terms of $CoO$ and $V_2O_5$, relative to a total of 100 parts by weight of the Si, Ba and Al components.

7. The ceramic composition according to claim 5, comprising:
   15.0 to 17.0 wt. % of the Al component, and 0.5 to 2.0 parts by weight of the third additive relative to a total of 100 parts by weight of the Si, Ba and Al components.

8. The ceramic composition according to claim 2, comprising:
   47.0 to 57.0 wt. % of the Si component, 10.0 to 15.0 wt. % of the Al component, and
   as the third additive, at least one of 2.0 to 4.0 parts by weight of the Zr component, 0.1 to 2.0 parts by weight of the Ti component, and 0.1 to 5.0 parts by weight in terms of each of of the Zn component and the Nb component, relative to a total of 100 parts by weight of the Si, Ba and Al components.

9. The ceramic composition according to claim 1, which is a calcined powder of the Si, Ba, Al and Ce components, and uncalcined Mn component.

10. A ceramic substrate comprising a ceramic layer of sintered ceramic composition according to claim 9.

11. A ceramic substrate comprising a ceramic layer of sintered ceramic composition according to claim 1.

12. The ceramic substrate according to claim 11, disposed in a laminate of a plurality of ceramic layers, and having a conductor pattern disposed on at least one superficial face or inside the laminate.

13. The ceramic substrate according to claim 12, wherein the conductor pattern comprises gold, silver or copper.

14. A ceramic substrate having a laminate structure comprising first and second superficial ceramic parts having a first coefficient of thermal expansion $\alpha 1$ and sandwiched therebetween an inner ceramic part having a second coefficient of thermal expansion $\alpha 2$ that is larger than the first coefficient of thermal expansion $\alpha 1$,
wherein each of the first and second superficial ceramic parts and the inner ceramic part is a sintered ceramic composition according to claim 1.

15. A ceramic substrate having a laminate structure comprising first and second superficial ceramic parts having a first coefficient of thermal expansion $\alpha 1$ and sandwiched therebetween an inner ceramic part having a second coefficient of thermal expansion $\alpha 2$ that is larger than the first coefficient of thermal expansion $\alpha 1$,
wherein each of the first and second superficial ceramic parts and the inner ceramic part is a sintered ceramic composition according to claim 2.

16. The ceramic substrate of claim 14 in which each of the first and second superficial ceramic parts have a thickness of 150 μm or less, and the difference between the coefficients of thermal expansion $\alpha 1$ and $\alpha 2$ is at least 0.5 ppm/° C.

17. A method for producing ceramic composition of claim 1 comprising:
calcining a mixture of the Si, Ba, Al and Ce components, thereby preparing a calcined powder, and
combining the second additive with the calcined powder.

18. A method for producing a ceramic green layer comprising calcining a mixture containing 47.0 to 67.0 wt. % of $SiO_2$, 27.0 to 52.0 wt. % of $BaCO_3$, 10.0 to 18.0 wt. % of $Al_2O_3$, and 1.0 to 5.0 parts by weight of $CeO_2$, relative to a total of 100 parts by weight of the $SiO_2$, $BaCO_3$ and $Al_2O_3$, thereby preparing a calcined powder,
combining 4.0 to 9.0 parts by weight of $MnCO_3$ relative to a total of 100 parts by weight of $SiO_2$, $BaCO_3$, $Al_2O_3$ and $CeO_2$, and an organic binder with the calcined powder, thereby preparing a ceramic slurry, and
forming thereby forming a ceramic green layer with the ceramic slurry.

19. A method of forming a burned laminate which comprises
providing a green laminate comprising a plurality of plies each of which comprises a slurry of the ceramic composition of claim 9, and at least one of which has a conductor pattern comprising gold, silver or copper on a superficial face thereof, and
burning the green laminate at a temperature higher than the sintering temperature of the ceramic composition but not exceeding the melting temperature of metal in the conductor pattern.

* * * * *